(12) United States Patent
Wang

(10) Patent No.: US 9,214,929 B2
(45) Date of Patent: Dec. 15, 2015

(54) WAVEFORM CONVERSION CIRCUIT WITH REDUCED JITTER

(71) Applicant: Zhengxiang Wang, Suzhou (CN)

(72) Inventor: Zhengxiang Wang, Suzhou (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/277,803

(22) Filed: May 15, 2014

(65) Prior Publication Data

US 2015/0061771 A1     Mar. 5, 2015

(30) Foreign Application Priority Data

Aug. 27, 2013   (CN) .......................... 2013 1 0377459

(51) Int. Cl.
*H03F 3/04*     (2006.01)
*H03K 5/08*     (2006.01)
*H03F 3/30*     (2006.01)

(52) U.S. Cl.
CPC *H03K 5/08* (2013.01); *H03F 3/301* (2013.01); *H03F 2200/18* (2013.01)

(58) Field of Classification Search
CPC . H03F 3/193; H03F 3/45475; H03F 3/45179; H03F 3/195; H03F 2003/45008; H03F 2200/294; H03F 3/45273; H03F 1/3205; H03F 1/342; H03F 1/483; H03F 2003/45017; H03F 2200/451; H03F 3/082; H03F 3/21
USPC .................................. 330/277, 285, 288, 296
See application file for complete search history.

(56) References Cited

U.S. PATENT DOCUMENTS

| | | | | |
|---|---|---|---|---|
| 4,140,977 | A * | 2/1979 | Ahmed | 330/288 |
| 5,999,039 | A | 12/1999 | Holst | |
| 6,127,880 | A | 10/2000 | Holst | |
| 6,265,929 | B1 * | 7/2001 | Hauser | 327/404 |
| 7,075,362 | B2 * | 7/2006 | North | 327/551 |
| 7,362,151 | B2 | 4/2008 | de la Torre | |
| 7,911,279 | B2 * | 3/2011 | Chow et al. | 330/311 |
| 8,198,930 | B2 | 6/2012 | Zerbe | |
| 8,854,139 | B2 * | 10/2014 | Fagg | 330/288 |

* cited by examiner

*Primary Examiner* — Khanh V Nguyen
(74) *Attorney, Agent, or Firm* — Charles Bergere

(57) ABSTRACT

An AC-inverting amplifier for a waveform conversion circuit includes a first MOS transistor of a first conductivity type having a gate that receives an input signal, a drain that provides an inverted amplified output signal, and a source coupled to a first power supply voltage. A current source provides a first bias current and a second bias current in proportion to the first bias current. The second bias current is coupled to the drain of the first MOS transistor to bias the first MOS transistor. The first bias current has a magnitude that is determined by a DC voltage applied at the gate of the first MOS transistor.

11 Claims, 7 Drawing Sheets

WAVEFORM CONVERSION CIRCUIT WITH REDUCED JITTER

BACKGROUND OF THE INVENTION

The present invention relates to a waveform conversion circuit, and more particularly, to a sinusoidal-to-square waveform conversion circuit that reduces power-supply-induced jitter in the resultant square wave signal.

In many electrical systems, there is a need to convert a sine wave from an oscillator, a power splitter, or other RF device into a square wave suitable for use by a digital logic circuit. There are numerous techniques for sinusoidal-to-square waveform conversion, among which a typical one is to use a CMOS inverter as shown in FIGS. 1A and 1B. FIG. 1A shows a typical CMOS inverter 100 that is commonly used in a conventional sinusoidal-to-square waveform conversion circuit, and FIG. 1B shows a transfer curve for the CMOS inverter 100.

As shown in FIG. 1A, the CMOS inverter 100 includes a first NMOS transistor 102 and a second PMOS transistor 104, which have their gates connected together and receive an input signal IN and their drain connected together to provide an output signal OUT. The second PMOS transistor 104 has a source coupled to a power supply voltage VDD, while the source of the first NMOS transistor is connected to ground.

FIG. 1B depicts a transfer curve of the CMOS inverter 100. When the input voltage Ui is at a low level, the first NMOS transistor 102 turns off and the second PMOS transistor 104 turns on. Thus, the output voltage $U_O$ goes high. On the other hand, if the input voltage Ui is high, the first NMOS transistor 102 turns on and the second PMOS transistor 104 turns off. Thus, the output voltage $U_O$ goes low. In a certain transition region between the low and high levels, both transistors 102 and 104 turn on and operate in a saturation state. At this point, the output voltage $U_O$ varies sharply with a small fluctuation of the input voltage Ui (point Q in FIG. 1B), resulting in a high gain. In a conventional sinusoidal-to-square waveform conversion circuit using the CMOS inverter 100, a static operation point of the CMOS inverter 100 can be biased by a DC component in the input signal IN in the high gain region, for example, at the point Q shown in FIG. 1B, and an AC component such as a sine wave signal in the input signal IN can be reverse amplified and reshaped into a square wave signal. In this regard, the CMOS inverter 100 is also called an inverting amplifier.

The CMOS inverter 100 is commonly used in conventional sinusoidal-to-square waveform conversion circuits due to its simple structure. However, it also has some shortcomings. For example, the CMOS inverter 100 has poor performance in rejecting power supply noise. Noise in the power supply voltage (VDD or GND) may cause jitter in the resulting square wave signal OUT, which prevents the waveform conversion circuit from being used in some high speed systems.

One way to combat power supply noise is to use a full differential architecture. In some cases, however, using a differential circuit is not feasible because the signal source may be single-ended. Another method to reduce power supply noise is to use a good regulator to produce a clean power supply voltage. However, the regulator consumes more power and requires additional circuit area.

Accordingly, there is a need for an improved sinusoidal-to-square waveform conversion circuit that overcomes one or more of the above problems.

BRIEF DESCRIPTION OF THE DRAWINGS

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

DETAILED DESCRIPTION OF THE INVENTION

Figure 1A:
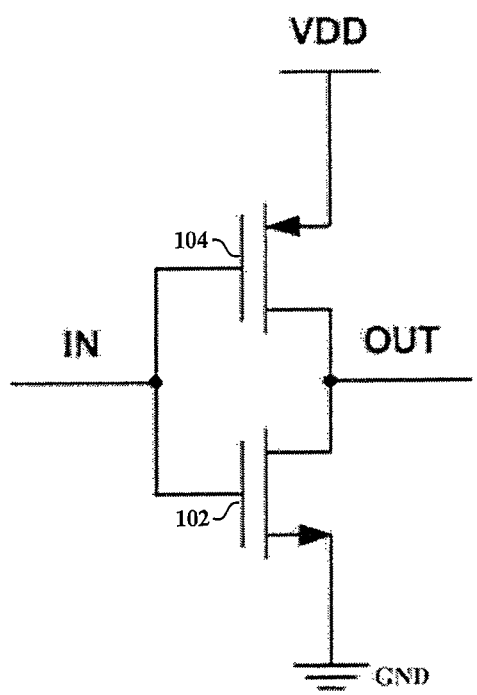
FIG. 1A is a schematic circuit diagram of a conventional CMOS inverter used to perform sinusoidal-to-square waveform conversion.
Figure 1B:
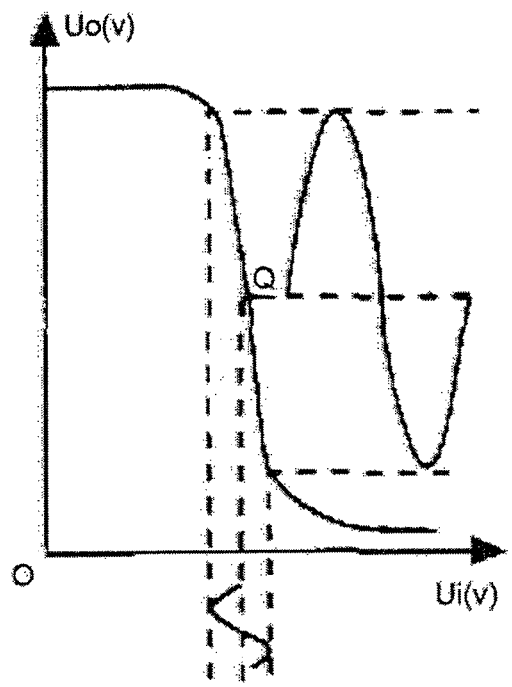
FIG. 1B is a graph showing a transfer curve of the CMOS inverter of FIG. 1A.

An aspect of the embodiments is to provide a sinusoidal-to-square waveform conversion circuit that can reduce power-supply-induced jitter in the resultant square wave signal.

In one embodiment, the present invention provides an AC-inverting amplifier including a first MOS transistor of a first conductivity type having a gate configured to receive an input signal, a drain configured to provide an inverted amplified output signal, and a source coupled to a first power supply voltage. A current source provides a first bias current and a second bias current in proportion to the first bias current. The second bias current is coupled to the drain of the first MOS transistor to bias the first MOS transistor. The first bias current has a magnitude that is determined by a DC voltage applied to the gate of the first MOS transistor.

In one embodiment, the current source may include a current mirror that provides the first and second bias currents; a second MOS transistor of the first conductivity type having a drain coupled to the first bias current and a source coupled to the first power supply voltage; and a low-pass filter having an input terminal connected to the gate of the first MOS transistor and an output terminal connected to a gate of the second MOS transistor to filter out an AC component in the input signal. The second MOS transistor may be biased into a saturation state such that the magnitude of the first bias current passing therethrough may be determined by the DC voltage on the gate of the first MOS transistor.

In another embodiment, the current mirror includes third and fourth MOS transistors of a second conductivity type having sources both coupled to a second power supply voltage, gates connected to each other and to a drain of the fourth MOS transistor, and drains connected respectively to the drains of the first and second MOS transistors. The second conductivity type is opposite to the first conductivity type.

According to another embodiment of the invention, a sinusoidal-to-square waveform conversion circuit includes an AC-inverting amplifier and a bias circuit. The AC-inverting amplifier comprises a first MOS transistor of a first conductivity type having a gate configured to receive a sine wave input signal, a drain configured to provide a first square wave output signal, and a source coupled to a first power supply voltage. A current source provides a first bias current and a second bias current in proportion to the first bias current. The second bias current is coupled to the drain of the first MOS transistor to bias the first MOS transistor. The bias circuit applies a bias voltage to the gate of the first MOS transistor to bias the AC-inverting amplifier at a predetermined static operation point. The first bias current may have a magnitude that is determined by the bias voltage applied to the gate of the first MOS transistor.

The embodiments of the sinusoidal-to-square waveform conversion circuit reduce power-supply-induced jitter in the converted square wave signal and thus is particularly useful in high speed applications.

The present invention will now be described in detail with reference to certain embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well know details have not been described in detail in order not to unnecessarily obscure the present invention.

Figure 2:
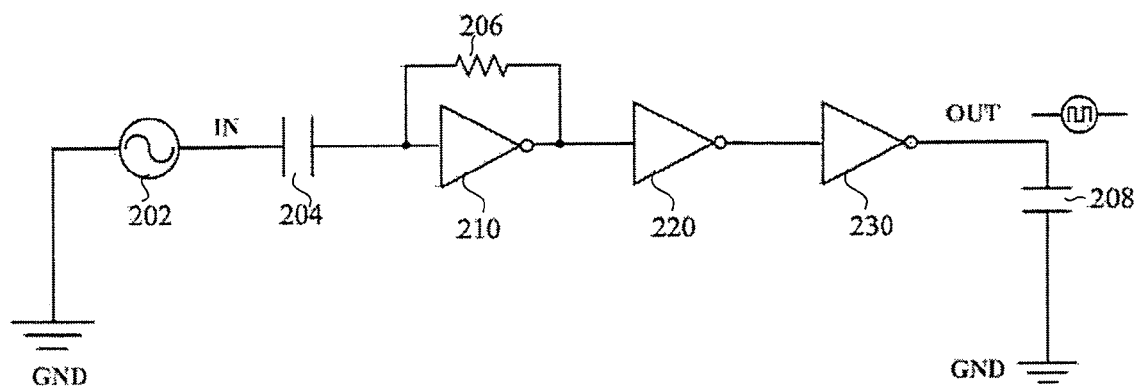
FIG. 2 is a schematic block diagram of a sinusoidal-to-square waveform conversion circuit in accordance with an exemplary embodiment of the present invention.

Referring now to FIG. 2, a schematic block diagram of a sinusoidal-to-square waveform conversion circuit 200 in accordance with an exemplary embodiment of the present invention is shown. The sinusoidal-to-square waveform conversion circuit 200 has three inverters 210, 220 and 230 connected in series and a bias resistor 206 connected in parallel with the first inverter 210. In one embodiment, the three inverters 210, 220 and 230 each comprise the conventional CMOS inverter 100 shown in FIG. 1A. The bias resistor 206 provides a DC bias voltage to the input of the first inverter 210 such that a static operation point Q of the first inverter 210 can be set in a high gain region. When the resistor 206 is connected across the input and output of the inverter 210, the static or DC operation point (Q) is set in a high gain region (both transistors work in saturation region); this is a well known method to bias the inverter 210 into the high gain region. The static operation point is also known as the DC operation point or quiet operation point. A sine wave signal IN generated by a signal generator 202, for example, is coupled to the input of the first inverter 210 via an input capacitor 204. The waveform conversion circuit 200 develops a square wave signal OUT at the output of the third inverter 230, which may be connected to a load capacitor 208.

Figure 3:
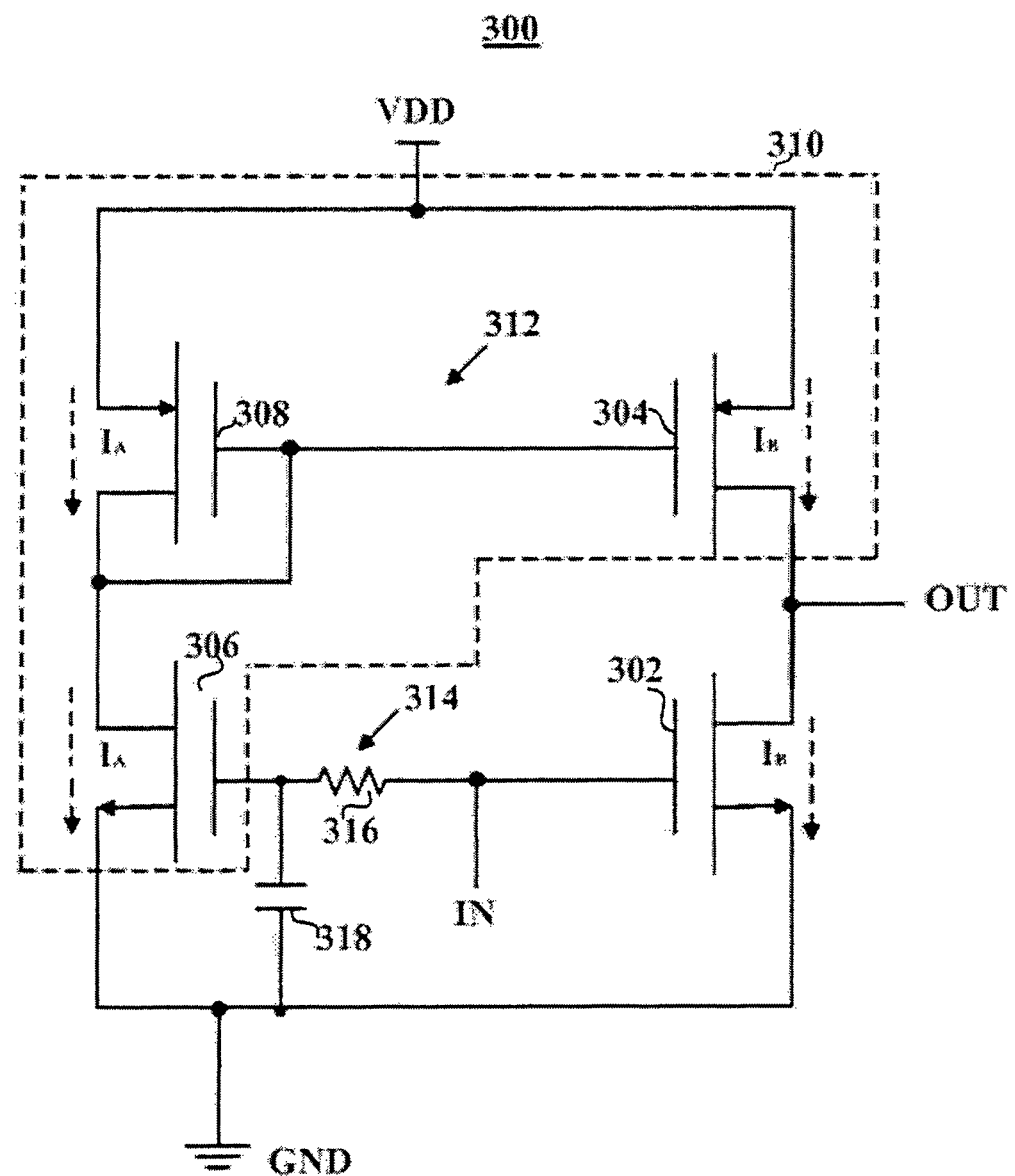
FIG. 3 is a schematic circuit diagram of an AC-inverting amplifier in accordance with an embodiment of the present invention.

FIG. 3 is a schematic circuit diagram of an AC-inverting amplifier 300 that is applicable to a sinusoidal-to-square waveform conversion circuit in accordance with an exemplary embodiment of the present invention, for example, to the first inverter 210 of the waveform conversion circuit 200.

The AC-inverting amplifier 300 comprises a first NMOS transistor 302 and a current source 310 interposed between the first NMOS transistor 302 and a power supply voltage VDD. The first NMOS transistor 302 receives an input signal IN at its gate and provides an output signal OUT at its drain. The source of the first NMOS transistor 302 is coupled to a power supply voltage such as a ground GND.

To alleviate the effect of noise riding on the power supply voltage VDD on the output signal OUT, the current source 310 is interposed between the first NMOS transistor 302 and the power supply voltage VDD to isolate the output signal OUT from the noisy power supply VDD. More specifically, the current source 310 comprises a second NMOS transistor 306 and a current mirror 312 that provides a first current as shown by a dashed-line arrow $I_A$, which passes through the second NMOS transistor 306, and a second current as shown by a dashed-line arrow $I_B$, which is in proportion to the first current $I_A$ and passes through the first NMOS transistor 302. In this embodiment, the current mirror 312 comprises a third PMOS transistor 304 and a fourth PMOS transistor 308. The third and fourth PMOS transistors 304 and 308 are connected at their sources to each other and to the power supply voltage VDD. The gates of the third and fourth PMOS transistors 304 and 308 are connected to each other and to the drain of the fourth PMOS transistor 308. A ratio of the first current $I_A$ to the second current $I_B$ ($I_A/I_B$) is substantially dependent on a ratio between a width/length ratio of a channel region of the fourth PMOS transistor 308 and a width/length ratio of a channel region of the third PMOS transistor 304, i.e.

$$\left( \frac{(W/L)_{PMOS4}}{(W/L)_{PMOS3}} \right).$$

The third PMOS transistor 304 has its drain connected to the drain of the first NMOS transistor 302 such that the second current $I_B$ biases the first NMOS transistor 302. The fourth PMOS transistor 308 has its drain connected to the drain of the second NMOS transistor 306. The source of the second NMOS transistor 306 is connected to the ground GND, and the gate of the second NMOS transistor 306 is DC coupled to the gate of the first NMOS transistor 302 with a low-pass filter 314 interposed therebetween to filter out an AC component in the input signal IN, as will be described later in more detail.

FIG. 3 shows a specific RC low-pass filter 314 that comprises a resistor 316 and a capacitor 318. The resistor 316 is connected between the gates of the first and second NMOS transistors 302 and 306 without separating the input signal IN from the gate of the first NMOS transistor 302. The capacitor 318 is connected between the gate of the second NMOS transistor 306 and the ground GND.

In an embodiment of the invention, the fourth PMOS transistor 308 and the second NMOS transistor 306 are sized smaller than the third PMOS transistor 304 and the first NMOS transistor 302, respectively, and thus the first current $I_A$ may be smaller than the second current $I_B$. In this embodiment, the AC-inverting amplifier 300 may be miniaturized and the power consumption thereof may be reduced.

Although not shown in FIG. 3, the AC-inverting amplifier 300 may further comprise a startup circuit connected to the gates of the third and fourth PMOS transistors 304 and 308 to set an initial or desired state thereof.

Now a static DC operation and a dynamic AC operation of the AC-inverting amplifier 300 will be discussed in more detail.

In the static DC operation, a DC component in the input signal IN is applied to the gate of the first NMOS transistor 302. Since there is no current between the gates of the first and second NMOS transistors 302 and 306, the gate of the second NMOS transistor 306 is biased by the DC voltage. The DC voltage may be selected such that the first and second NMOS transistors 302 and 306 both operate in a saturation state. In this embodiment, the static operation point of the AC-inverting amplifier 300 may be biased in a high gain region, preferably, at VDD/2.

Since the second NMOS transistor 306 operates in the saturation state, the first current $I_A$ passing therethrough has a magnitude that depends on the DC bias voltage on the gate of the second NMOS transistor 306, i.e. the DC voltage in the input signal IN applied to the gate of the first NMOS transistor 302. In other words, the second NMOS transistor 306 sets the first current $I_A$ at a constant value by using a constant DC bias voltage on its gate, and thus the second current $I_B$ is kept constant because it is in proportion to the first current $I_A$. In this regard, the fluctuation at the power supply voltage VDD does not result in fluctuation in the second current $I_B$. Accordingly, the current source 310 reduces the effect of noise at the power supply voltage VDD on the output signal OUT at the drain of the first NMOS transistor 302.

In the dynamic AC operation of the AC-inverting amplifier 300, an AC component such as a sine wave signal superimposed on the DC component in the input single IN is provided to the gate of the first NMOS transistor 302. Since the static operation point of the AC-inverting amplifier 300 is biased in the high gain region, the drain of the first NMOS transistor 302 provides an inverse amplified AC signal. On the other hand, the sine wave signal is filtered out by the low-pass filter 314 disposed between the gates of the first and second NMOS transistors 302 and 306 and thus it cannot disturb the gate of the second NMOS transistor 306, which maintains the rejection of the noise at the power supply VDD.

Figure 4:
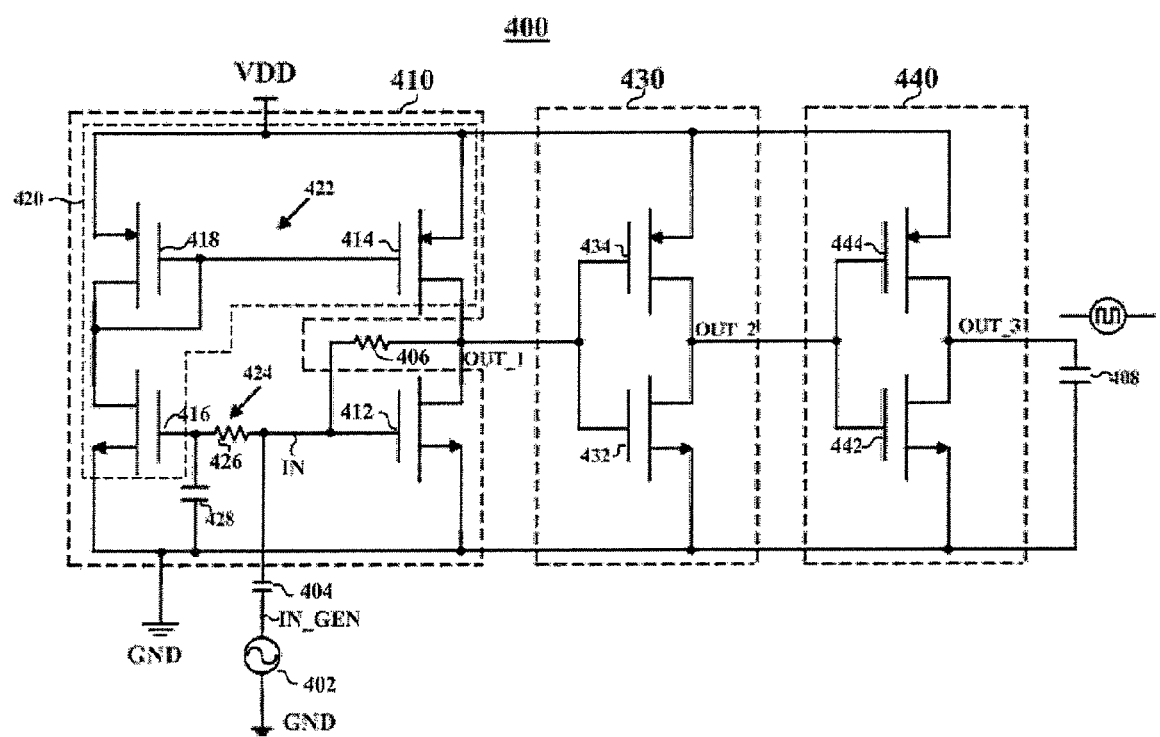
FIG. 4 is a schematic circuit diagram of a sinusoidal-to-square waveform conversion circuit in accordance with an embodiment of the present invention that includes the AC-inverting amplifier of FIG. 3.

FIG. 4 is a schematic circuit diagram of a sinusoidal-to-square waveform conversion circuit 400 in accordance with an exemplary embodiment of the invention, which is substantially the same as the sinusoidal-to-square waveform conversion circuit 200 except that the AC-inverting amplifier 300 shown in FIG. 3 is applied to the first inverter 210 of the sinusoidal-to-square waveform conversion circuit 200. Referring to FIG. 4, the sinusoidal-to-square waveform conversion circuit 400 comprises an AC-inverting amplifier 410, a first inverter 430 and a second inverter 440 connected in series. A bias resistor 406 is connected between the input and output of the AC-inverting amplifier 410 to bias the static operation point of the AC-inverting amplifier 410 in a high gain region. A sine wave signal IN generated by, for example, a signal generator 402, is AC coupled via an input capacitor 404 to the input of the AC-inverting amplifier 410.

The AC-inverting amplifier 410 comprises a first NMOS transistor 412 and a current source 420 interposed between the first NMOS transistor 412 and a power supply voltage VDD. The first NMOS transistor 412 receives the input signal IN at its gate and provides an output signal OUT_1 at its drain. The source of the first NMOS transistor 412 is coupled to the ground GND. The current source 410 comprises a second NMOS transistor 416 and a current mirror 422. In this embodiment, the current mirror 422 comprises a third PMOS transistor 414 and a fourth PMOS transistor 418. The third and fourth PMOS transistors 414 and 418 are connected at their sources to the power supply voltage VDD and at their drains to the drains of the first and second NMOS transistors 412 and 416, respectively. The gates of the third and fourth PMOS transistors 414 and 418 are connected to each other, and the fourth PMOS transistor 418 further has its gate connected to its drain. The fourth PMOS transistor 418 provides a first current ($I_A$ in FIG. 3) that passes through the second NMOS transistor 416. The third PMOS transistor 414 provides a second current ($I_B$ in FIG. 3) that is in proportion to the first current $I_A$ and passes through the first NMOS transistor 412. The source of the second NMOS transistor 416 is connected to the ground GND, and the gate of the second NMOS transistor 416 is DC coupled via a low-pass filter 424 to the gate of the first NMOS transistor 412. The low-pass filter 424 comprises a resistor 426 and a capacitor 428. The resistor 426 is connected between the gates of the first and second NMOS transistors 412 and 416 without separating the sine wave input signal IN from the gate of the first NMOS transistor 412. The capacitor 428 is connected between the gate of the second NMOS transistor 416 and the ground GND.

Although not shown in FIG. 4, the AC-inverting amplifier 410 may further comprise a startup circuit connected to the gates of the third and fourth PMOS transistors 414 and 418 to set an initial or desired state thereof.

Hereinafter, operation of the AC-inverting amplifier 410 of the sinusoidal-to-square waveform conversion circuit 400 will be discussed in more detail. First, the static DC operation of the circuit 400 will be described. In the static DC operation, the bias resistor 406 feeds a DC voltage at the output of the AC-inverting amplifier 410 (or the drain of the first NMOS transistor 412) back to the input of the AC-inverting amplifier 410 (or the gate of the first NMOS transistor 412) since there is no DC current from/to the gate of the first NMOS transistor 412. The feedback voltage biases the AC-inverting amplifier 410 such that the static operation point thereof is set in a high gain region (e.g., Vdd/2; usually this region is very narrow centered around one-half of the power supply VDD). Due to its symmetry, the static operation point is set by the relative strengths between the third PMOS transistor 414 and the first NMOS transistor 412. To reduce the duty distortion, in a preferred embodiment, the feedback voltage is equal to the switching threshold of the inverter 430, which is usually one half of the power supply VDD (or the difference between VDD and ground). To this end, the width/length ratio of the channel region of the third PMOS transistor 414 is about three times larger than the width/length ratio of the channel region of the first NMOS transistor 412.

The present invention may also employ other bias circuits that apply a bias voltage to the gate of the first NMOS transistor 412 such that the AC-inverting amplifier 410 is biased at a desired static operation point.

With the proper static operation point, all MOS transistors in the AC-inverting amplifier 410 operate in saturation region. In the saturation region, the first current $I_A$ passing through the second NMOS transistor 414 has a magnitude that is determined by the DC bias voltage on the gate of the second NMOS transistor 414. That is to say, the second NMOS transistor 414 fixes the first current $I_A$ by the constant bias voltage on its gate, and thus the second current IB is kept constant because it is in proportion to the first current $I_A$. Thus, the current source 420 reduces the effect of noise at the power supply VDD on the output signal OUT_1 at the drain of the first NMOS transistor 412.

In an embodiment of the invention, the fourth PMOS transistor 418 and the second NMOS transistor 416 are sized smaller than the third PMOS transistor 414 and the first NMOS transistor 412, respectively, and the first current $I_A$ is smaller than the second current $I_B$ accordingly. In this embodiment, the AC-inverting amplifier 410 may be miniaturized and the power consumption thereof reduced.

Now the dynamic AC operation of the AC-inverting amplifier 410 will be discussed in detail. Referring again to FIG. 4, the signal generator 402 provides a sine wave input signal IN_GEN to the input of the AC-inverting amplifier 410. The sine wave input signal IN_GEN is filtered first by a high-pass filter (input capacitor 404) to isolate the DC component of the sine wave input signal IN_GEN from the input (the gate of the first NMOS transistor 412) of the AC-inverting amplifier 410. The high-pass filter 404 may include (but is not limited to) the capacitor 404 shown in FIG. 4. The capacitor 404, the bias resistor 406 and the size of the first NMOS transistor 412 are selected to determine the cut-off frequency of the high-pass filter 404. Then, the filtered sine wave input signal IN is provided at the gate of the first NMOS transistor 412.

Since the AC-inverting amplifier 410 is biased in the high gain region, the small sine wave signal at the gate of the first NMOS transistor 412 results in an inversely amplified, square-reshaped signal OUT_1 at the drain of the first NMOS transistor 412. On the other hand, the sine wave input signal IN does not disturb the DC bias voltage at the gate of the second NMOS transistor 416 because of the low-pass filter 424 disposed between the gates of the first and second NMOS transistors 412 and 416. In a preferred embodiment, the low-pass filter 424 has a cut-off frequency ten or more times lower than the frequency of the sine wave input signal IN_GEN.

Referring still to FIG. 4, the preliminarily square-reshaped signal OUT_1 from the AC-inverting amplifier 410 is provided to the first inverter 430 where it is further reshaped into a better square wave signal. The preliminarily square-reshaped signal has much sharper rising and falling edges than those of the sine wave input signal IN and thus the noise in the power supply voltage VDD does not deteriorate the jitter performance of the preliminarily square-reshaped signal substantially, so the first inverter 430 does not need to employ the AC-inverting amplifier 300 of FIG. 3. In this embodiment, the first inverter 430 comprises a simple CMOS inverter comprising a fifth NMOS transistor 432 and a sixth PMOS transistor 434. The fifth NMOS transistor 432 and the sixth PMOS transistor 434 have their gates connected to each other and further to the drain of the first NMOS transistor 412 so as to receive the preliminary square wave signal OUT_1, and their drains connected to each other and providing a secondary square wave signal OUT_2 that has a better square shape than the preliminary square wave signal OUT_1. The source of the sixth PMOS transistor 434 is connected to the power supply voltage VDD, and the source of the fifth NMOS transistor 432 is connected to the ground GND.

For the AC-inverting amplifier 410, it is very important to set an operation point that matches the threshold of the inverter 430 such that the duty cycle distortion may be minimized. The switching threshold of the inverter 430 is determined by the sixth PMOS transistor 434 and the fifth NMOS transistor 432. If a ratio between the width/length ratio of a channel region of the sixth PMOS transistor 434 and the width/length ratio of a channel region of the fifth NMOS transistor 432 is 3:1, the threshold will be about one-half of VDD. When the input of the inverter ramps up from low to high, the output of the inverter will go from high to low, and vice-versa. As is known by those of skill in the art, the switching point regarding the input is called the threshold of the inverter. In an exemplary embodiment of the invention, a ratio between the width/length ratio of the channel region of the first NMOS transistor 412 and the width/length ratio of the third PMOS transistor 414, a ratio between the width/length ratio of the second NMOS transistor 416 and the width/length ratio of the fourth PMOS transistor 418, and a ratio between the width/length ratio of the fifth NMOS transistor 432 and the width/length ratio of the sixth PMOS transistor 434 are equal to each other. In this case, because of the symmetrical arrangement of the PMOS and NMOS transistors 418 and 416, the PMOS and NMOS transistors 414 and 412, and the PMOS and NMOS transistors 434 and 432, the operation point of the AC-inverting amplifier 410 will always track the threshold of the first CMOS inverter 430, regardless of process, voltage and temperature variation (PVT). In a preferred embodiment, the ratio is about 1/3, and thus the DC feedback voltage is about VDD/2, which allows for a wider dynamic range of the amplifier. Referring still to FIG. 4, the waveform conversion circuit 400 further comprises a second CMOS inverter 440. The second CMOS inverter 440 comprises a seventh NMOS transistor 442 and an eighth PMOS transistor 444. The seventh NMOS transistor 442 and the eighth PMOS transistor 444 have their gates connected to each other and further to the drains of the NMOS and PMOS transistors 432 and 434 to receive the secondary square wave signal OUT_2, and their drains connected to each other and serving to provide a final square wave signal OUT_3. The source of the PMOS transistor 444 is connected to the power supply voltage VDD, and the source of the NMOS transistor 442 is connected to the ground GND. The second CMOS inverter 440 further reshapes the secondary square wave signal OUT_2 from the first CMOS inverter 430 to provide a more regular square wave signal OUT_3. In one embodiment, a ratio between the width/length ratio of the PMOS transistor 444 and the width/length ratio of the NMOS transistor 442 is equal to the ratio between the width/length ratio of the PMOS transistor 434 and the width/length ratio of the NMOS transistor 432. In an embodiment of the invention, the PMOS transistor 444 and the NMOS transistor 442 are sized larger and thus stronger than the PMOS transistor 434 and the NMOS transistor 432, respectively, so as to drive a capacitive load 408.

Figure 5:
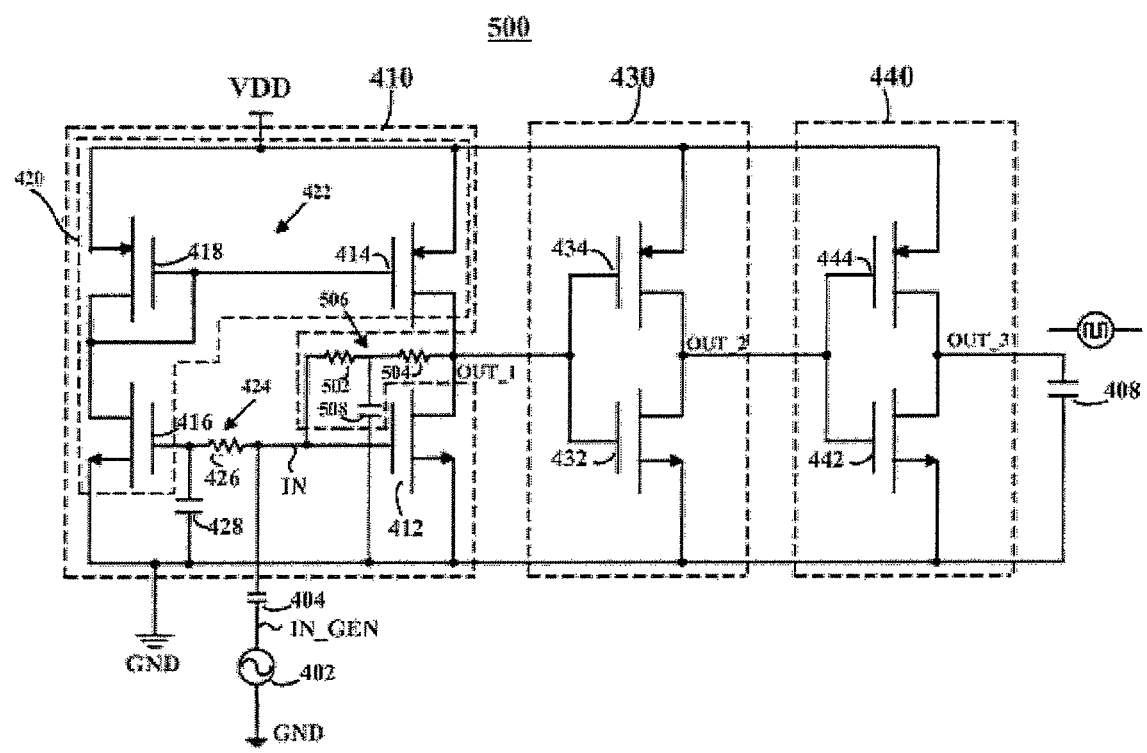
FIG. 5 is a schematic circuit diagram of a sinusoidal-to-square waveform conversion circuit in accordance with another embodiment of the present invention.

In the waveform conversion circuit 400 of FIG. 4, the bias resistor 406 needs to have a resistance high enough to reduce an AC feedback component from the drain of the first NMOS transistor 412 to a satisfactory degree. The AC feedback component may decrease the gain of the AC-inverting amplifier 410. However, a high resistance bias resistor requires more area. FIG. 5 shows a sinusoidal-to-square waveform conversion circuit 500 in accordance with another exemplary embodiment of the invention, which is substantially the same as the waveform conversion circuit 400 except that the bias resistor 406 is replaced by another bias circuit 506. As shown in FIG. 5, the bias circuit 506 comprises two resistors 502 and 504 that are connected in series between the input (the gate of the first NMOS transistor 412) and output (the drain of the first NMOS transistor 412) of the AC-inverting amplifier 410, and a capacitor 508 that is connected between the ground GND and a node between the resistors 502 and 504. Thus, the AC component in the feedback signal is filtered out by the RC low-pass filter included in the bias circuit 506.

Figure 6:
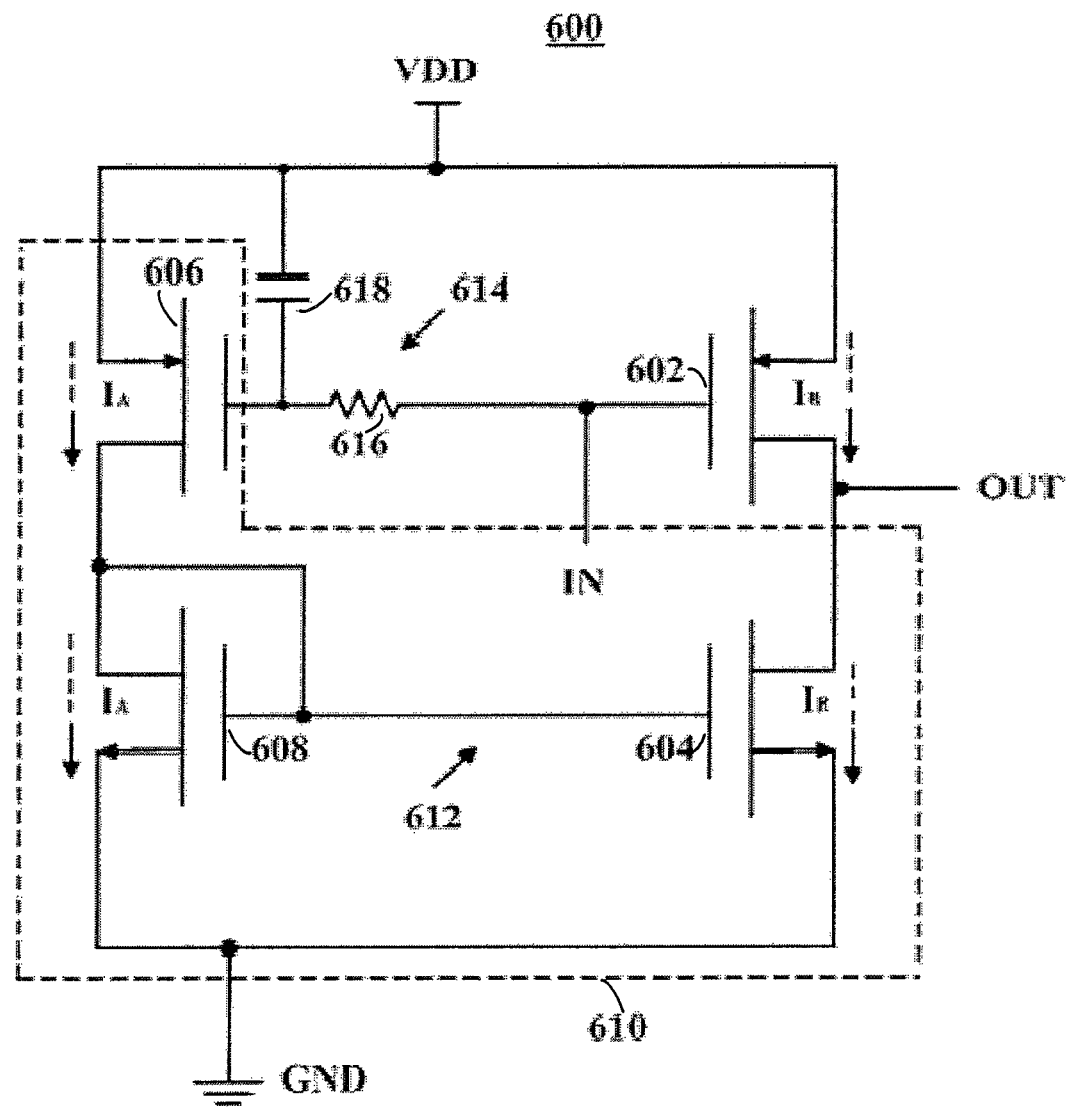
FIG. 6 is a schematic circuit diagram of an AC-inverting amplifier in accordance with another embodiment of the present invention.

In the above embodiments, the current source 310 or 420 is interposed between the power supply voltage VDD and the NMOS transistor 302 or 412 to reduce the effect of the noise at the power supply voltage VDD on the output signal. In some electronic devices, however, the ground GND may contain unacceptable noise, which may also deteriorate the jitter performance of the output signal. FIG. 6 shows an embodiment of an AC-inverting amplifier 600 in accordance with another embodiment of the present invention that can reduce the ground-induced jitter in the output signal.

Referring to FIG. 6, the AC-inverting amplifier 600 comprises a first PMOS transistor 602 and a current source 610 interposed between the first PMOS transistor 602 and a power supply voltage GND. The first PMOS transistor 602 receives an input signal IN at its gate and provides an output signal OUT at its drain. The source of the first PMOS transistor 602 is coupled to a power supply voltage VDD. The current source 610 comprises a second PMOS transistor 606 and a current mirror 612 that provides a first current as shown by a dashed-line arrow $I_A$, which passes through the second PMOS transistor 606, and a second current as shown by a dashed-line arrow $I_B$, which is in proportion to the first current $I_A$ and passes through the first PMOS transistor 602. In this embodiment, the current mirror 612 comprises a third NMOS transistor 604 and a fourth NMOS transistor 608. The third and fourth NMOS transistors 604 and 608 are connected at their sources to the power supply voltage GND. The gates of the third and fourth NMOS transistors 604 and 608 are connected to each other, and the fourth NMOS transistor 608 has its gate connected to its drain. The third and fourth NMOS transistors 604 and 608 have their drains connected to the drains of the first and second PMOS transistors 602 and 606, respectively. The source of the second PMOS transistor 606 is connected to the power supply voltage VDD, and the gate of the second PMOS transistor 606 is DC coupled to the gate of the first PMOS transistor 602 with a low-pass filter 614 interposed therebetween to filter out an AC component in the input signal IN. The low-pass filter 614 comprises a resistor 616 and a capacitor 618. The resistor 616 is connected between the gates of the first and second PMOS transistors 602 and 606 without separating the input signal IN from the gate of the first PMOS transistor 602. The capacitor 618 is connected between the gate of the second PMOS transistor 606 and the power supply voltage VDD. Other aspects of the AC-inverting amplifier 600 are the same as those of the AC-inverting amplifier 300 shown in FIG. 3, and thus a repetitive description thereof will be omitted herein.

Figure 7:
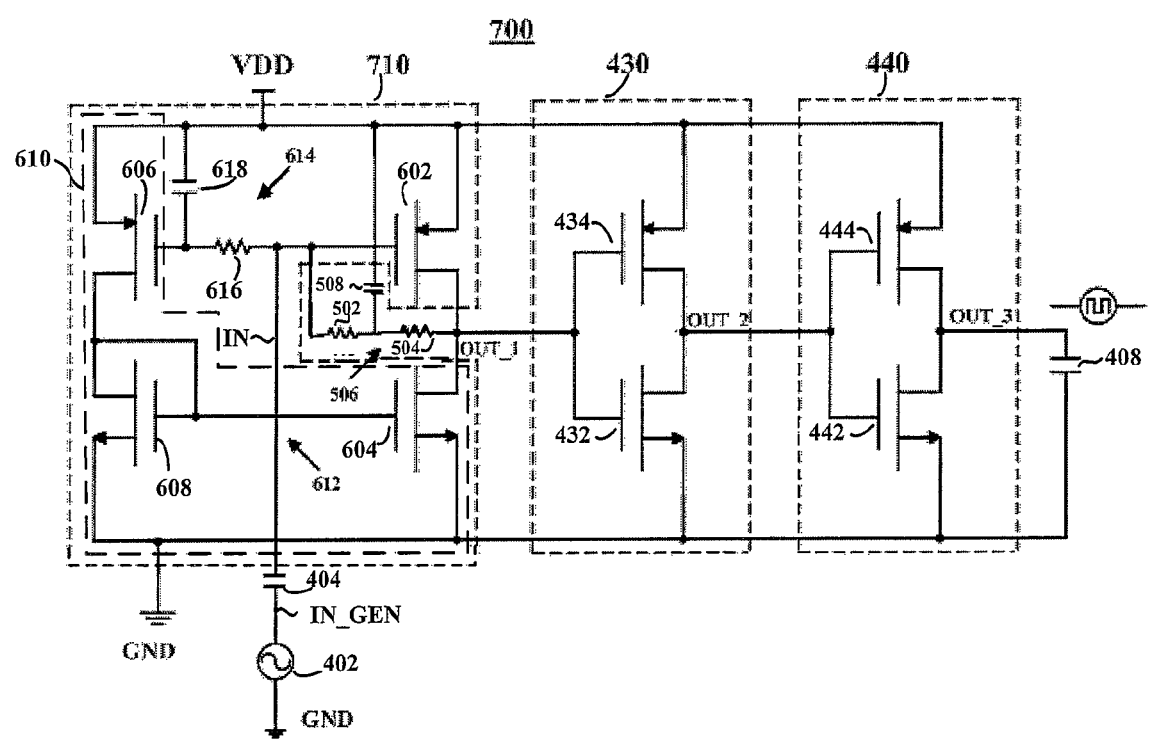
FIG. 7 is a schematic circuit diagram of a sinusoidal-to-square waveform conversion circuit that includes the AC-inverting amplifier of FIG. 6 in accordance with another embodiment of the present invention.

FIG. 7 is a schematic circuit diagram of a sinusoidal-to-square waveform conversion circuit 700 in accordance with an exemplary embodiment of the invention. The conversion circuit 700 is substantially the same as the waveform conversion circuit 500 (FIG. 5) except that the AC-inverting amplifier 410 is replaced with the AC-inverting amplifier 600 (FIG. 6), and now labeled as 710. The AC-inverting amplifier 710 reduces the ground-induced jitter in the output signal. Other aspects of the waveform conversion circuit 700 are the same as for the waveform conversion circuit 500, and repetitive description thereof has been omitted.

Computer simulation has been performed to compare the performance of a conventional sinusoidal-to-square waveform conversion circuit using the CMOS inverter shown in FIG. 1A versus the conversion circuit 400. In the simulation, a sine wave input signal is set at a frequency of 40 MHz, amplitude of 300 mV, and the power supply voltage VDD is set at 1.4V superimposed with various values of sine wave noise with the amplitude of such as 5 mV, 10 mV and 20 mV at a frequency of 1 MHz and 5 MHz. Jitter was then measured and the results shown in Table 1. As can be seen, for the varying values of noise, the conversion circuit 400 exhibits better performance than the conventional conversion circuit.

TABLE 1

|  | Jitter (ps) for noise (5 mV, 1 MHz) | Jitter (ps) for noise (10 mV, 1 MHz) | Jitter (ps) for noise (20 mV, 1 MHz) | Jitter (ps) for noise (20 mV, 5 MHz) |
| --- | --- | --- | --- | --- |
| conventional | 8 ps | 15 ps | 31 ps | 59 ps |
| circuit conversion circuit 400 | 5 ps | 8 ps | 13 ps | 15 ps |

Figure 8:
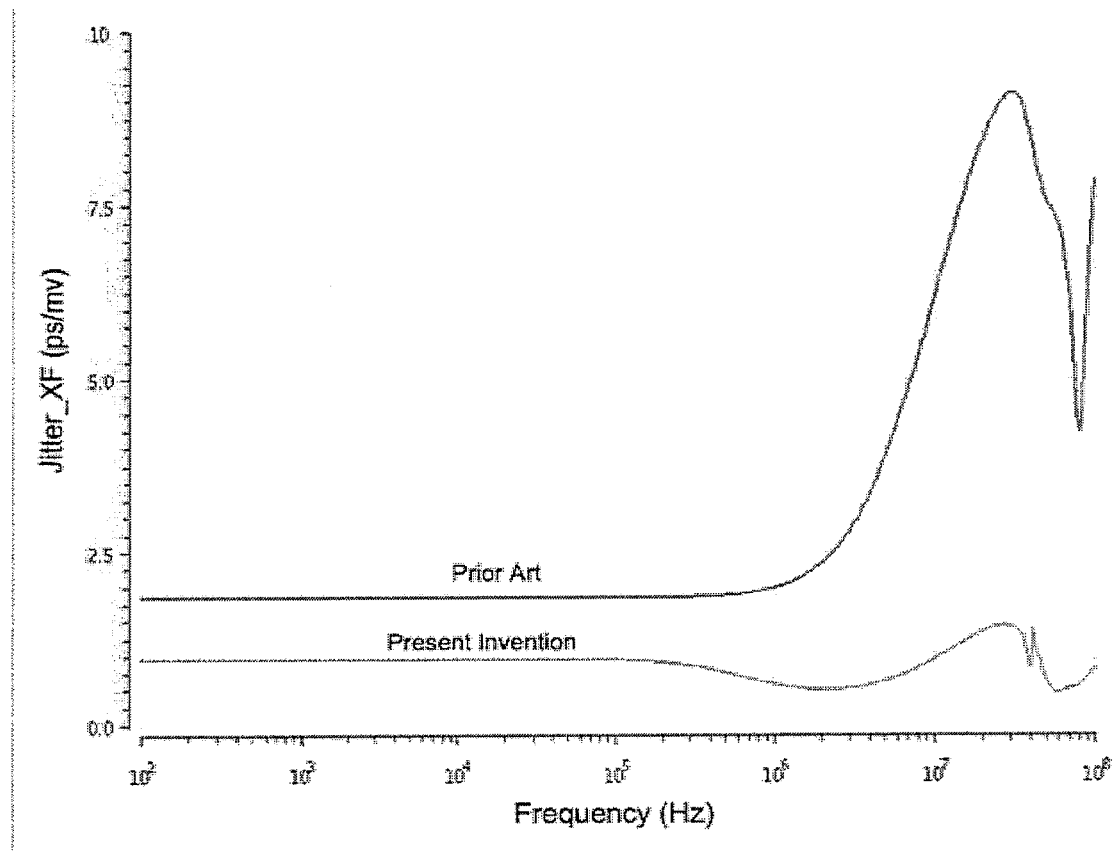
FIG. 8 is a graph showing a jitter transfer function in the frequency domain of a sinusoidal-to-square wave form conversion circuit of the present invention and a waveform of a conventional sinusoidal-to-square waveform conversion circuit.

FIG. 8 is a graph showing a computer simulation result illustrating a noise-to-jitter transfer function versus the frequency of the noise riding on the power supply VDD between the conversion circuit 400 of the present invention and a conventional conversion circuit, such as the circuit 100. It can be seen that in a frequency region higher than about $2 \times 10^5$ Hz, and especially in a high frequency region above $10^6$ Hz, the circuit 400 reduces the jitter remarkably.

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

The invention claimed is:

1. A sinusoidal-to-square waveform conversion circuit, comprising:
   a first AC-inverting amplifier comprising:
     a first MOS transistor of a first conductivity type, having a gate configured to receive an input signal, a drain configured to provide an inverted amplified output signal, and a source coupled to a first power supply voltage; and
     a current source configured to provide a first bias current and a second bias current in proportion to the first bias current, wherein the second bias current is provided to the drain of the first MOS transistor to bias the first MOS transistor; and
   a bias circuit configured to apply a bias voltage to the gate of the first MOS transistor to bias the first AC-inverting amplifier at a predetermined static operation point,
   wherein the first bias current has a magnitude that is determined by the bias voltage applied on the gate of the first MOS transistor,
   wherein the current source comprises:
     a current mirror that provides the first and second bias currents;
     a second MOS transistor of the first conductivity type having a drain that receives the first bias current, and a source coupled to the first power supply voltage, wherein the second MOS transistor is biased in a saturation region such that the magnitude of the first bias current passing therethrough is determined by the bias voltage on the gate of the first MOS transistor; and
     a low-pass filter having an input terminal connected to the gate of the first MOS transistor and an output terminal connected to a gate of the second MOS transistor, for filtering the sine wave input signal,
   wherein the current mirror comprises:
     third and fourth MOS transistors of a second conductivity type opposite to the first conductivity type, the third and fourth MOS transistors having sources both coupled to a second power supply voltage, drains connected respectively to the drains of the first and second MOS transistors, and gates connected to each other and further to the drain of the fourth MOS transistor, and wherein the bias voltage applied by the bias circuit to the gate of the first MOS transistor equals half of an absolute value of a difference between the first power supply voltage and the second power supply voltage.

2. The sinusoidal-to-square waveform conversion circuit of claim 1, wherein the low-pass filter comprises:
a resistor connected between the gate of the first MOS transistor and the gate of the second MOS transistor; and
a capacitor connected between the gate of the second MOS transistor and the first power supply voltage.

3. The sinusoidal-to-square waveform conversion circuit of claim 1, wherein the first conductivity type is an N type, and the first power supply voltage is less than the second power supply voltage.

4. The sinusoidal-to-square waveform conversion circuit of claim 1, wherein the first conductivity type is an P type, and the first power supply voltage is higher than the second power supply voltage.

5. The sinusoidal-to-square waveform conversion circuit of claim 1, wherein the bias voltage equals a voltage on the drain of the first MOS transistor.

6. The sinusoidal-to-square waveform conversion circuit of claim 1, wherein the bias circuit comprises:
first and second resistors connected in series between the drain and gate of the first MOS transistor; and
a capacitor connected between the first power supply voltage and a point between the first and second resistors.

7. The sinusoidal-to-square waveform conversion circuit of claim 1, wherein the low-pass filter has a cutoff frequency that is ten or more times lower than a frequency of the sine wave input signal.

8. The sinusoidal-to-square waveform conversion circuit of claim 1, further comprising:
a first CMOS inverter comprising a fifth MOS transistor of the first conductivity type and a sixth MOS transistor of the second conductivity type, wherein the fifth and sixth MOS transistors have gates connected to each other and further to the drain of the first MOS transistor to receive the first square wave output signal, sources connected respectively to the first and second power supply voltages, and drains connected to each other and providing a second square wave output signal.

9. The sinusoidal-to-square waveform conversion circuit of claim 8, wherein a ratio between a width/length ratio of a channel region of the first MOS transistor $(W/L)_{MOS1}$ and a width/length ratio of a channel region of the third MOS transistor $(W/L)_{MOS3}$, a ratio between a width/length ratio of a channel region of the second MOS transistor $(W/L)_{MOS2}$ and a width/length ratio of a channel region of the fourth MOS transistor $(W/L)_{MOS4}$, and a ratio between a width/length ratio of a channel region of the fifth MOS transistor $(W/L)_{MOS5}$ and a width/length ratio of a channel region of the sixth MOS transistor $(W/L)_{MOS6}$ are equal to each other.

10. The sinusoidal-to-square waveform conversion circuit of claim 8, further comprising:
a second CMOS inverter comprising a seventh MOS transistor of the first conductivity type and an eighth MOS transistor of the second conductivity type, wherein the seventh and eighth MOS transistors have gates connected to each other and further to the drains of the fifth and sixth MOS transistors to receive the second square wave output signal, sources connected respectively to the first and second power supply voltages, and drains connected to each other and providing a third square wave output signal.

11. The sinusoidal-to-square waveform conversion circuit of claim 10, wherein the seventh and eighth MOS transistors are sized larger than the fifth and sixth MOS transistors, respectively.

* * * * *